United States Patent
Basin et al.

(10) Patent No.: US 11,302,849 B2
(45) Date of Patent: Apr. 12, 2022

(54) PIGMENTED AND SCATTERING PARTICLES IN SIDE COATING MATERIALS FOR LED APPLICATIONS

(71) Applicant: Lumileds LLC, San Jose, CA (US)

(72) Inventors: Grigoriy Basin, San Francisco, CA (US); Kentaro Shimizu, Sunnyvale, CA (US); Brendan Moran, San Jose, CA (US); Emma Dohner, Redwood City, CA (US); Noad Shapiro, Fremont, CA (US); Marcel Bohmer, Eindhoven (NL)

(73) Assignee: Lumileds LLC, San Jose, CA (US)

( * ) Notice: Subject to any disclaimer, the term of this patent is extended or adjusted under 35 U.S.C. 154(b) by 173 days.

(21) Appl. No.: 16/664,617

(22) Filed: Oct. 25, 2019

(65) Prior Publication Data

US 2021/0126166 A1 Apr. 29, 2021

(51) Int. Cl.
*H01L 33/50* (2010.01)
*H01L 33/46* (2010.01)
*F21V 7/30* (2018.01)
*F21V 7/24* (2018.01)

(52) U.S. Cl.
CPC .............. *H01L 33/504* (2013.01); *F21V 7/24* (2018.02); *F21V 7/30* (2018.02); *H01L 33/46* (2013.01); *H01L 2933/0025* (2013.01); *H01L 2933/0041* (2013.01); *H01L 2933/0091* (2013.01)

(58) Field of Classification Search
None
See application file for complete search history.

(56) References Cited

U.S. PATENT DOCUMENTS

| | | | |
|---|---|---|---|
| 2008/0265749 A1 | 10/2008 | Bechtel et al. | |
| 2011/0175117 A1 | 7/2011 | Jagt et al. | |
| 2012/0286220 A1* | 11/2012 | Takasu | C08L 83/04 252/582 |
| 2014/0339495 A1* | 11/2014 | Bibl | H01L 33/504 257/13 |
| 2014/0367633 A1* | 12/2014 | Bibl | H01L 27/322 257/13 |

(Continued)

FOREIGN PATENT DOCUMENTS

WO 2019236325 A1 12/2019

OTHER PUBLICATIONS

From the EPO as the ISA, Notification of Transmittal of the International Search Report and the Written Opinon of the International Searching Authority, or the Declaration, PCT/US2020/057015, dated Jan. 22, 2021, 12 pages.

(Continued)

*Primary Examiner* — Suberr L Chi

(57) ABSTRACT

Phosphor-converted LED side reflectors disclosed herein comprise pigments that are photochemically stable under illumination by light from the pcLED. The pigments absorb light in at least a portion of the spectrum of light emitted by the first phosphor converted LED. The side reflector may also comprise light scattering particles and/or air voids. The pigments, light scattering particles and/or air voids may be homogeneously distributed in the reflector. Alternatively the side reflector may be layered, with the pigments, light scattering particles and/or air voids inhomogeneously distributed in the reflector. The side reflector may comprise phosphor particles.

20 Claims, 4 Drawing Sheets

(56) References Cited

U.S. PATENT DOCUMENTS

2018/0331144 A1 11/2018 Lu et al.
2019/0189679 A1 6/2019 Kwak et al.
2019/0198727 A1 6/2019 Shen et al.
2020/0041085 A1 2/2020 Miyairi et al.
2020/0243729 A1 6/2020 Bohmer et al.
2020/0212100 A1 7/2020 Masui et al.

OTHER PUBLICATIONS

The extended European search report corresponding to EP application No. 20157143.7, dated Jun. 24, 2020, 6 pages.
European Search Report corresponding to EP 20157143, dated Jun. 15, 2020, 2 pages.

* cited by examiner

PIGMENTED AND SCATTERING PARTICLES IN SIDE COATING MATERIALS FOR LED APPLICATIONS

FIELD OF THE INVENTION

The invention relates generally to phosphor-converted light emitting diodes.

BACKGROUND

Semiconductor light emitting diodes and laser diodes (collectively referred to herein as "LEDs") are among the most efficient light sources currently available. The emission spectrum of an LED typically exhibits a single narrow peak at a wavelength determined by the structure of the device and by the composition of the semiconductor materials from which it is constructed. By suitable choice of device structure and material system, LEDs may be designed to operate at ultraviolet, visible, or infrared wavelengths.

LEDs may be combined with one or more wavelength converting materials (generally referred to herein as "phosphors") that absorb light emitted by the LED and in response emit light of a longer wavelength. For such phosphor-converted LEDs ("pcLEDs"), the fraction of the light emitted by the LED that is absorbed by the phosphors depends on the amount of phosphor material in the optical path of the light emitted by the LED, for example on the concentration of phosphor material in a phosphor layer disposed on or around the LED and the thickness of the layer.

Phosphor-converted LEDs may be designed so that all of the light emitted by the LED is absorbed by one or more phosphors, in which case the emission from the pcLED is entirely from the phosphors. In such cases the phosphor may be selected, for example, to emit light in a narrow spectral region that is not efficiently generated directly by an LED.

Alternatively, pcLEDs may be designed so that only a portion of the light emitted by the LED is absorbed by the phosphors, in which case the emission from the pcLED is a mixture of light emitted by the LED and light emitted by the phosphors. By suitable choice of LED, phosphors, and phosphor composition, such a pcLED may be designed to emit, for example, white light having a desired color temperature and desired color-rendering properties.

A highly reflective side coating is often used in top emitter LED applications to redirect the light coming out through the side walls of the LED to a wavelength converting structure positioned on the top surface of the die. If the areas of the side walls of the LED die are of significant size, for example around 40% of photons generated by the die will go unconverted if there is no reflector coating located over the side wall areas.

One method for forming side wall reflectors is to apply a layer of light scattering particles mixed with a binder (e.g., silicone) onto the side walls, for example by dispensing or molding. Because reflection of light incident on such a reflector occurs through a series of reflection (scattering)/refraction events, a long path length and correspondingly large thickness of the reflective layer perpendicular to the die is typically required to provide sufficient reflection and extinction of excess light.

Existing side coat materials include $TiO_2$ powder particles in liquid silicone, and $SiO_2/Al_2O_3$ fiber or Glass fiber/$TiO_2$/silicone molding compounds. The transmission of these materials is typically such that if the reflector layer surrounding the die/converter has a thickness<250 microns, blue photons from the LED and converted light from the wavelength converter can penetrate though the reflector. Photons that penetrate through the reflector can then be scattered by or absorbed in neighboring pcLEDs, a process referred to as cross-talk. Photons leaking through the reflector can also cause color shift of the pcLED, over-converted red output, and affect contrast.

Some pcLED applications require a thin side coat on the sides of the LED emitter and at the same time are very sensitive to photons penetrating the thin side coat and causing color shift of and cross-talk between the pcLEDs. This is critical for applications (automotive, flash, projection, display, etc.) where optical contrast is an important optical parameter. For example, if pcLEDs are arranged in an array with a narrow spacing (e.g., <40 microns) between pcLEDs, blue photons from the LEDs can easily penetrate through a thin $TiO_2$/silicone layer between adjacent pcLEDs, causing cross-talk and color change.

SUMMARY

Side reflector coating materials disclosed herein for use in side reflectors for pcLEDs comprise pigments that are photochemically stable under illumination by light from the pcLED. The pigments absorb light emitted by the pcLED. By pigments is meant material that absorbs light and does not in response emit light of a longer wavelength. Pigments therefore differ from phosphors. In some variations the pigments absorb blue and green light and transmit or reflect red light. In some variations the pigments absorb blue and red light and transmit or reflect green light. In some variations, pigments reflect blue light and absorb green and/or red light. The side coating materials may comprise light scattering particles (e.g., $TiO_2$ particles) dispersed in a transparent binder material (e.g., a silicone or a solgel) in which the pigments are also dispersed. The side coating material may optionally also comprise phosphor particles. The pigments may be inorganic or organic pigments.

Small concentrations of pigments in such side coating materials can help to decrease light leakage through the side walls and also help to tailor the color point of the pcLED. For thin-film flip-chip LEDs lacking a sapphire substrate the advantages s of these pigments may be more substantial.

Side coatings and side coating materials as disclosed herein may be employed, for example, with pcLED arrays used in automotive, flash, illumination, and display applications.

Other embodiments, features and advantages of the present invention will become more apparent to those skilled in the art when taken with reference to the following more detailed description of the invention in conjunction with the accompanying drawings that are first briefly described.

DETAILED DESCRIPTION OF THE DRAWINGS

The following detailed description should be read with reference to the drawings, in which identical reference numbers refer to like elements throughout the different figures. The drawings, which are not necessarily to scale, depict selective embodiments and are not intended to limit the scope of the invention. The detailed description illustrates by way of example, not by way of limitation, the principles of the invention.

Figure 1:
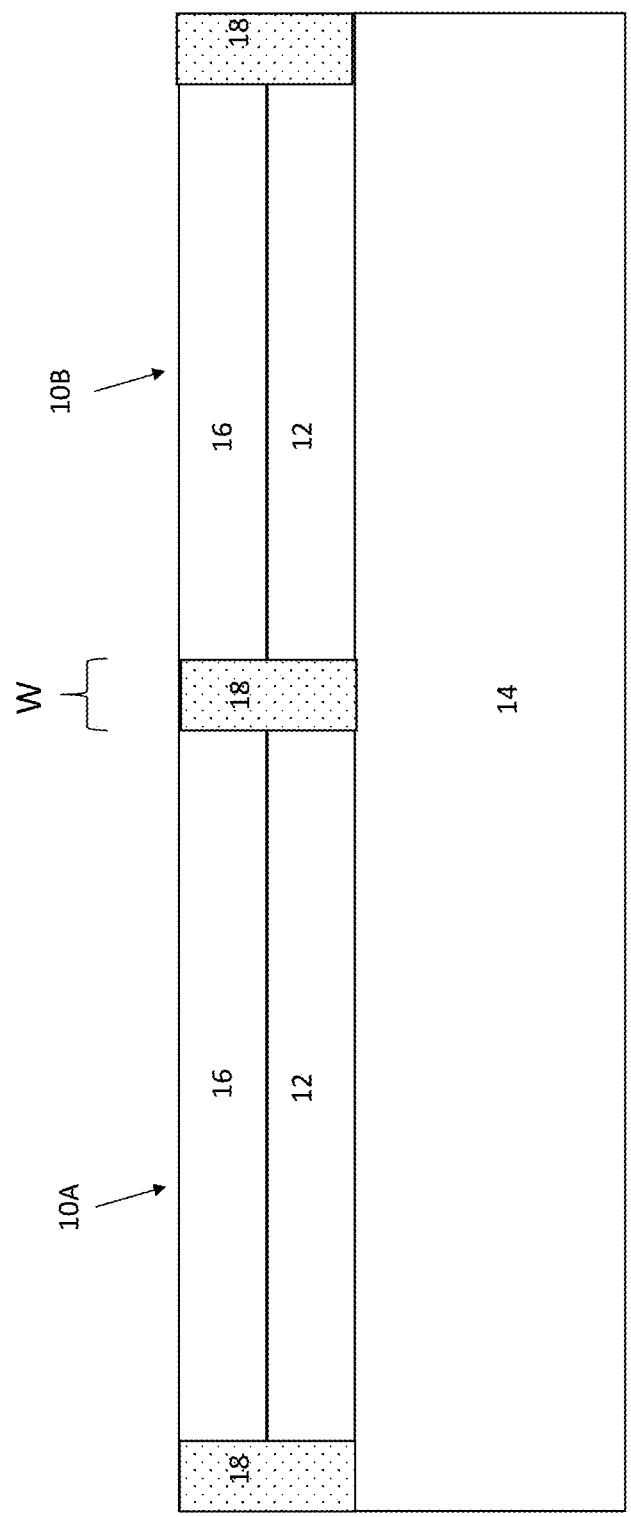
FIG. 1 shows a schematic cross-sectional view of a portion of an example pcLED array according to the invention.

FIG. 1 shows a schematic cross-sectional view of two adjacent individual pcLED pixels 10A, 10B on a shared substrate 14 in a pcLED array. The pcLED array may comprise many more such pcLED pixels arranged on a shared substrate, but only two are shown here for simplicity of presentation. Each pcLED pixel comprises an LED 12 disposed on substrate 14, and a wavelength converting structure 16 disposed on the LED. The pcLEDs are spaced apart from each other by a street (i.e., trench or gap) having a width W. The streets may have widths W of 5 to 30 microns, for example, or any other suitable width. An optional off state white layer, not shown, may be disposed on the top light output surface of each wavelength converting structure. Off-state white layers typically strongly scatter ambient light and consequently appear white when the pcLED is not operating, but become less scattering at the elevated temperatures resulting from pcLED operation.

Although in FIG. 1 the streets are shown as being defined by straight parallel pcLED side walls oriented perpendicularly to the substrate, in other variations the LED side walls, the wavelength converter sidewalls, or both the LED side walls and the wavelength converter side walls may be angled with respect to the substrate. The streets may therefore by narrower toward the top light emitting surface of the pcLEDs than near the substrate, or alternatively wider near the top light emitting surface of the pcLEDs than near the substrate.

The array of pcLED pixels may be formed using any suitable methods. The streets between pixels may be formed for example by photoresist patterning, mechanical sawing, or laser patterning. The wavelength converting structures may be formed directly on the LEDs, or an array of wavelength converters may be separately formed and then attached to an array of LEDs to form the array of pcLED pixels.

Each LED 12 comprises an active region disposed between n-type and p-type layers. Application of a suitable forward bias across the diode structure results in emission of light from the active region. The LEDs may be, for example III-Nitride LEDs that emit blue, violet, or ultraviolet light. LEDs formed from any other suitable material system and that emit any other suitable wavelength of light may also be used. Other suitable material systems may include, e.g. III-Phosphide materials, III-Arsenide materials, and II-VI materials.

Wavelength converting structures 16 may comprise, for example, phosphor particles dispersed in a binder. Suitable binders may include silicones and solgels, for example. Alternatively, wavelength converting structures 16 may comprise ceramic phosphor structures, formed for example by sintering phosphor particles. The wavelength converting structures may comprise phosphors of only a single composition, or phosphors of two or more different compositions. Phosphors in wavelength converting structure 16 may, for example, convert blue light to red, yellow, green, or cyan light. Any suitable phosphor materials may be used, depending on the desired optical output from the pcLED.

Reflective side coats 18 are disposed on the sides of the pcLEDs, in the streets between adjacent pcLEDs. Reflective side coats 18 may fill the streets as shown in FIG. 1. Alternatively adjacent pcLEDs may each have a side coat 18 in the street between the pixels, without completely filling the street.

As summarized above, reflective side coats 18 are formed from a material comprising pigments that are photochemically stable under illumination by light from the LED and from the wavelength converting structure. These pigments absorb light from the pcLED, decreasing light leakage through the side walls. This allows effective isolation of adjacent pcLED pixels with much thinner reflective side walls than would be necessary without the pigments. Because the pigments can be chosen to selectively absorb only portions of the spectrum of light from the pcLED, they also may help tailor the color point of the pcLED.

Suitable inorganic green pigments (absorbing blue and red light) may include, for example, $Co_2TiO_4$, $Zn_2TiO_4$, $Ni_2TiO_4$, or $(Co, Zn, Ni)_2TiO_4$. Suitable inorganic red pigments (absorbing blue and green light) may include, for example, $BiO_4V$ (bismuth vanadate). Suitable inorganic blue pigments (absorbing green and red light) may include, for example, $CoAl_2O_4$ or YInMn-blue. Suitable organic blue and green pigments may include, for example, phtalocyanines. Suitable organic red pigments may include, for example, perylenes.

Also as summarized above, the pigments may be dispersed with light scattering particles in a binder, and optionally with phosphor particles in the binder as well. An advantage of including phosphor particles is that when adjacent pcLED pixels are outputting light there would be less of a dark gap between the operating pixels, without use of external optics to blur the resolution. The phosphor particles in the reflective side coat may, for example, convert blue light from the LED to red, yellow, green, or cyan light.

The side coating material may be applied to the pcLED array to fill the streets by, for example, a dispensing, spraying, or molding process. Excess side coat material, for example disposed on the light output top surface of a wavelength converting structure or on the light output top surface of an off-state white layer disposed on the wavelength converting structure, can be removed by mechanical abrasion, planarization, polishing or grinding, for example.

After deposition, the reflective side coat 18 may comprise, for example, $TiO_2$ light scattering particles, air voids, inorganic or organic pigments, and optionally phosphor particles, all dispersed homogeneously in a silicone or solgel binder matrix. The air voids may act as light scatterers, and may also reduce the refractive index of the binder matrix. In this variation the difference between the refractive index of the phosphor particles and the surrounding matrix is typically homogeneous throughout the reflector.

Alternatively, the reflective side coat may comprise two or more layers oriented parallel to the sides of the pcLEDs. A first layer, disposed on the side of the pcLED, may comprise light scattering particles (and optionally air voids) dispersed in a transparent silicon or solgel matrix. A second layer, disposed on the first layer and spaced apart from the pcLED by the first layer, may comprise pigments dispersed in a transparent silicon or solgel matrix. The separate layers may comprise different binder matrices. Such a layered structure maximizes the light scattering/reflecting effect of the first (e.g., TiO$_2$) layer while maintaining the absorption/light extinguishing effect of the pigment containing layer.

The layered structure can be made by sequential application of the first layer with a thickness less than the street width, followed by application of the second layer. The layering can also be performed by first filling the street with side coat material for the first layer, then sawing a smaller street within the first layer, then filling the new street with the material for the second layer.

The resulting layered reflective side coat structure between two adjacent pcLED pixels may comprise, for example, a first light scattering particle layer disposed on the side wall of one of the pcLED pixels, a second light scattering particle layer disposed on the side wall of the other of the adjacent pcLED pixels, and one or more pigment layers disposed between the first and second light scattering layers. Reflective side coat 18 may comprise additional layers between the two adjacent pcLED pixels, as suitable. In such a layered structure, phosphor particles may optionally be dispersed in the light scattering particle layer, in the pigment layer, or in both the light scattering layer and the pigment layer.

In a layered side coat reflective structure as just described, the difference between the refractive index of the phosphor particles and the surrounding matrix may vary with distance from the pcLED side wall (e.g., have a gradient) because the matrix is layered rather than homogeneous and the matrix index of refraction may be different in different layers. Depending on the layer structure, the refractive index may for example vary gradually, or more strongly as for example a step function.

Figures 2A, 2B:
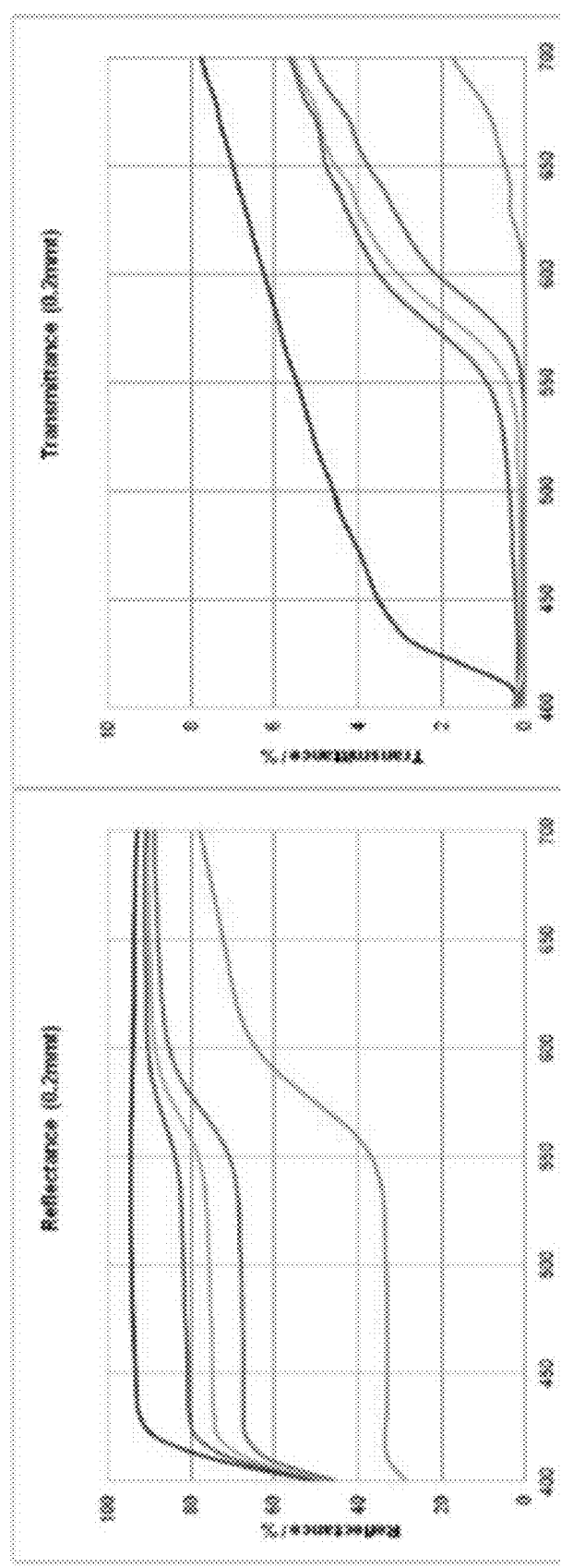
FIG. 2A shows reflection spectra of side coat material samples comprising different concentrations of a blue absorbing pigment.
FIG. 2B shows corresponding transmission spectra for the samples of FIG. 2A.

FIG. 2A and FIG. 2B show, respectively, reflection and transmission spectra of side coat material samples comprising different concentrations of approximately 0.5 to 1 micron diameter particles of blue absorbing pigment Fe$_2$O$_3$ uniformly dispersed in a TiO$_2$/silicone mixture. In both figures, referring to the curves from top (first) to bottom (fifth), the first curve is for a sample with no pigment, the second curve is for a sample comprising 0.01% pigment, the third curve is for a sample comprising 0.02% pigment, the fourth curve is for a sample comprising 0.05% pigment, and the fifth curve is for a sample comprising 0.5% pigment (all % by weight).

Figure 3A:
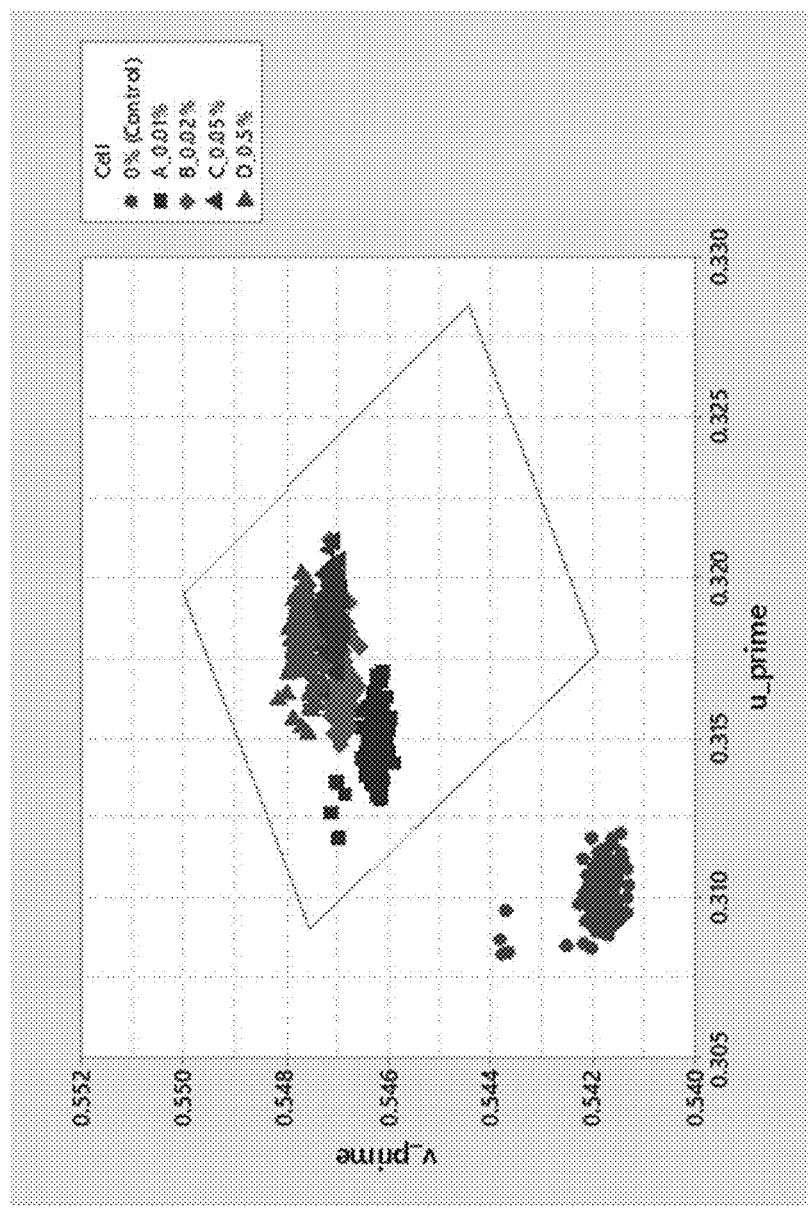
FIG. 3A shows color point coordinates u' and v' for the output of pcLEDs having reflective side walls formed with the sample side coat materials of FIGS. 2A and 2B.
Figure 3B:
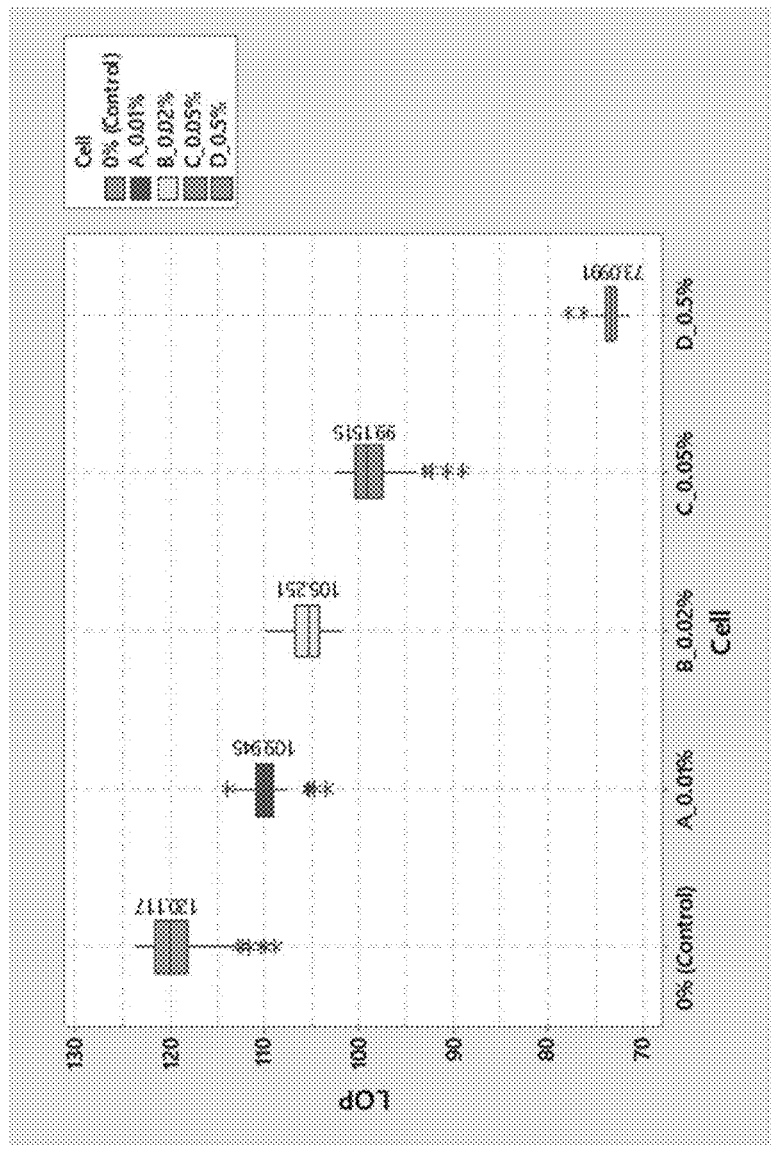
FIG. 3B compares total light output from the pcLEDs of FIG. 3A.

FIG. 3A shows color point coordinates u' and v' for the output of pcLEDs having reflective side walls formed with these sample side coat materials, and demonstrates that increasing sidewall light absorption of blue light by sidewalls of increasing pigment concentration moves the color point of the pcLEDs to higher u' and v' color points. FIG. 3B shows that the increasing pigment concentrations reduces the total light output from the pcLEDs. Images of these pcLEDs in operation (not shown) demonstrate that side light leakage from the pcLEDs decreases with increasing pigment concentration in the side wall reflectors.

This disclosure is illustrative and not limiting. Further modifications will be apparent to one skilled in the art in light of this disclosure and are intended to fall within the scope of the appended claims.

The invention claimed is:

1. A light emitting device comprising:
a substrate;
a first phosphor converted LED pixel comprising a first LED disposed on the substrate, a first wavelength converting structure disposed on a surface of the first LED with the first LED between the first wavelength converting structure and the substrate, a first light emitting external surface located with the first phosphor converted LED pixel between the first light emitting external surface and the substrate, and a first set of side walls extending from the substrate to the first light emitting external surface;
a second phosphor converted LED pixel comprising a second LED disposed on the substrate, a second wavelength converting structure disposed on a surface of the second LED with the second LED between the second wavelength converting structure and the substrate, a second light emitting external surface located with the second phosphor converted LED pixel between the second light emitting external surface and the substrate, and a second set of side walls extending from the substrate to the second light emitting external surface, the second phosphor converted LED pixel being spaced apart from the first phosphor converted LED pixel by a street defined by the substrate and corresponding side walls of the respective first and second sets that face each other across the street; and
a side reflector disposed in the street on the corresponding side wall of the first set, the side reflector including one or more pigments that absorb light in at least a portion of a spectrum of light emitted by the first phosphor converted LED pixel.

2. The light emitting device of claim 1, wherein one or more of the pigments absorb blue light.

3. The light emitting device of claim 2, wherein one or more of the pigments absorb green light and transmit or reflect red light.

4. The light emitting device of claim 2, wherein one or more of the pigments absorb red light and transmit or reflect green light.

5. The light emitting device of claim 1, wherein one or more of the pigments reflect or transmit blue light and absorb green light, absorb red light, or absorb green light and red light.

6. The light emitting device of claim 1, wherein the one or more pigments are dispersed in a transparent binder material.

7. The light emitting device of claim 6, wherein the transparent binder material includes air voids.

8. The light emitting device of claim 1, wherein the side reflector includes light scattering particles.

9. The light emitting device of claim 8, wherein the one or more pigments and the light scattering particles are distributed homogenously in a transparent binder material.

10. The light emitting device of claim 9, wherein the transparent binder material is in contact with the corresponding side wall of the second set and fills the street.

11. The light emitting device of claim 9, the side reflector including phosphor particles distributed homogeneously in the transparent binder material.

12. The light emitting device of claim 11, wherein the transparent binder material is in contact with the corresponding side wall of the second set and fills the street.

13. The light emitting device of claim 8, wherein:
the light scattering particles are dispersed in a first layer of transparent binder material disposed on the corresponding side wall of the first set; and
the one or more pigments are dispersed in a second layer of transparent binder material disposed on the first layer with the first layer between the second layer and the corresponding side wall of the first set.

14. The light emitting device of claim 13, the side reflector further including one or more additional pigments disposed in the first layer.

15. The light emitting device of claim 8, wherein:

a first plurality of the light scattering particles is dispersed in a first layer of transparent binder material disposed on the corresponding side wall of the first set;

a second plurality of the light scattering particles is dispersed in a second layer of transparent binder material disposed on the corresponding side wall of the second set;

the one or more pigments are disposed in a third layer of transparent binder material disposed between the first layer and the second layer; and the side reflector fills the street.

16. The light emitting device of claim 15, the side reflector further including a first plurality of phosphor particles dispersed in the transparent binder material of the first layer and a second plurality of phosphor particles dispersed in the transparent binder material of the second layer.

17. A composition of matter for use as a reflective side coat on LEDs, the composition of matter comprising:

a transparent liquid or gel binder material;

light scattering particles dispersed in the binder material;

one or more pigments dispersed in the binder material; and phosphor particles dispersed in the binder material, one or more of the pigments absorbing light at a wavelength emitted by the phosphor particles.

18. The composition of matter of claim 17, wherein the one or more pigments absorb blue light and green light and transmit or reflect red light.

19. The composition of matter of claim 17, wherein the one or more pigments absorb blue light and red light and transmit or reflect green light.

20. The composition of matter of claim 17, wherein the one or more pigments reflect or transmit blue light and absorb green light, absorb red light, or absorb green light and red light.

\* \* \* \* \*